(12) United States Patent
Arndt et al.

(10) Patent No.: US 7,514,723 B2
(45) Date of Patent: Apr. 7, 2009

(54) OPTOELECTRONIC COMPONENT

(75) Inventors: Karlheinz Arndt, Regensburg (DE); Nadir Farchtchian, Santa Clara, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 220 days.

(21) Appl. No.: 10/497,388

(22) PCT Filed: Dec. 2, 2002

(86) PCT No.: PCT/DE02/04404

§ 371 (c)(1), (2), (4) Date: Feb. 1, 2005

(87) PCT Pub. No.: WO03/049204

PCT Pub. Date: Jun. 12, 2003

(65) Prior Publication Data

US 2005/0127377 A1  Jun. 16, 2005

(30) Foreign Application Priority Data

Nov. 30, 2001 (DE) .............................. 101 58 753
Sep. 11, 2002 (DE) .............................. 102 41 989

(51) Int. Cl.
*H01L 33/00* (2006.01)
(52) U.S. Cl. ...................................................... 257/99
(58) Field of Classification Search ........... 257/99–100, 257/40, 79–81, 433–436, E25.032
See application file for complete search history.

(56) References Cited

U.S. PATENT DOCUMENTS

| 3,875,456 | A |   | 4/1975 | Kano et al. |
| 3,903,413 | A |   | 9/1975 | Manning |
| 4,047,075 | A |   | 9/1977 | Schoberl |
| 4,152,624 | A |   | 5/1979 | Knaebel |
| 5,035,483 | A |   | 7/1991 | Waitl et al. |
| 5,656,847 | A |   | 8/1997 | Okazaki et al. |
| 6,066,861 | A | * | 5/2000 | Hohn et al. .................... 257/99 |
| 6,376,902 | B1 | * | 4/2002 | Arndt ........................... 257/678 |
| 6,593,598 | B2 | * | 7/2003 | Ishinaga ....................... 257/98 |

(Continued)

FOREIGN PATENT DOCUMENTS

| DE | 24 57 572 A | 6/1975 |
| DE | 25 09 047 A | 9/1976 |
| DE | 33 23 259 C2 | 1/1985 |
| DE | 196 38 667 A1 | 4/1998 |
| EP | 0400175 A1 | 12/1990 |

(Continued)

OTHER PUBLICATIONS

F. Mollmer et al., "Siemens SMT-Top LED for Surface Mounting", Siemens Components 29, Issue 4, pp. 147-149, (1991).
Translation of Japanese Office Action dated Oct. 12, 2007 issued in corresponding application No. 02823930.X (pp. 1-3 are English and pp. 4-14 are German).
English translation of JP 10-284759.

*Primary Examiner*—Nathan W Ha
(74) *Attorney, Agent, or Firm*—Cohen Pontani Lieberman & Pavane LLP

(57) ABSTRACT

Optoelectronic component, having a basic body or housing (2), at least one optoelectronic semiconductor chip (3) arranged in a recess of the basic body, and a potting composition (5) made of a transparent material, which potting composition embeds the at least one semiconductor chip in the recess, the transparent potting composition (5) being formed in diffusely scattering fashion and in particular containing diffuser particles (6) at which light impinging thereon is diffusely scattered.

22 Claims, 16 Drawing Sheets

U.S. PATENT DOCUMENTS

| | | | |
|---|---|---|---|
| 6,624,491 B2 * | 9/2003 | Waitl et al. ................... | 257/434 |
| 6,730,939 B2 | 5/2004 | Eisert et al. | |
| 7,026,756 B2 * | 4/2006 | Shimizu et al. ............. | 313/503 |
| 2001/0026011 A1 | 10/2001 | Reese et al. | |
| 2005/0110123 A1 * | 5/2005 | Waitl et al. .................. | 257/678 |
| 2006/0022212 A1 * | 2/2006 | Waitl et al. .................... | 257/98 |
| 2006/0138442 A1 * | 6/2006 | Waitl et al. .................... | 257/99 |

FOREIGN PATENT DOCUMENTS

| | | |
|---|---|---|
| EP | 1 249 874 A | 10/2000 |
| JP | 62 004380 A | 6/1987 |
| JP | 02 238680 A | 12/1990 |
| JP | 8-248901 | 9/1996 |
| JP | 9-64420 | 3/1997 |
| JP | 10284759 | 10/1998 |
| JP | 2000124504 A | 4/2000 |
| JP | 2000 156525 A | 10/2000 |
| JP | 2001-075508 | 3/2001 |
| WO | WO 98/12757 A | 3/1998 |
| WO | WO 00/55914 A | 9/2000 |

* cited by examiner

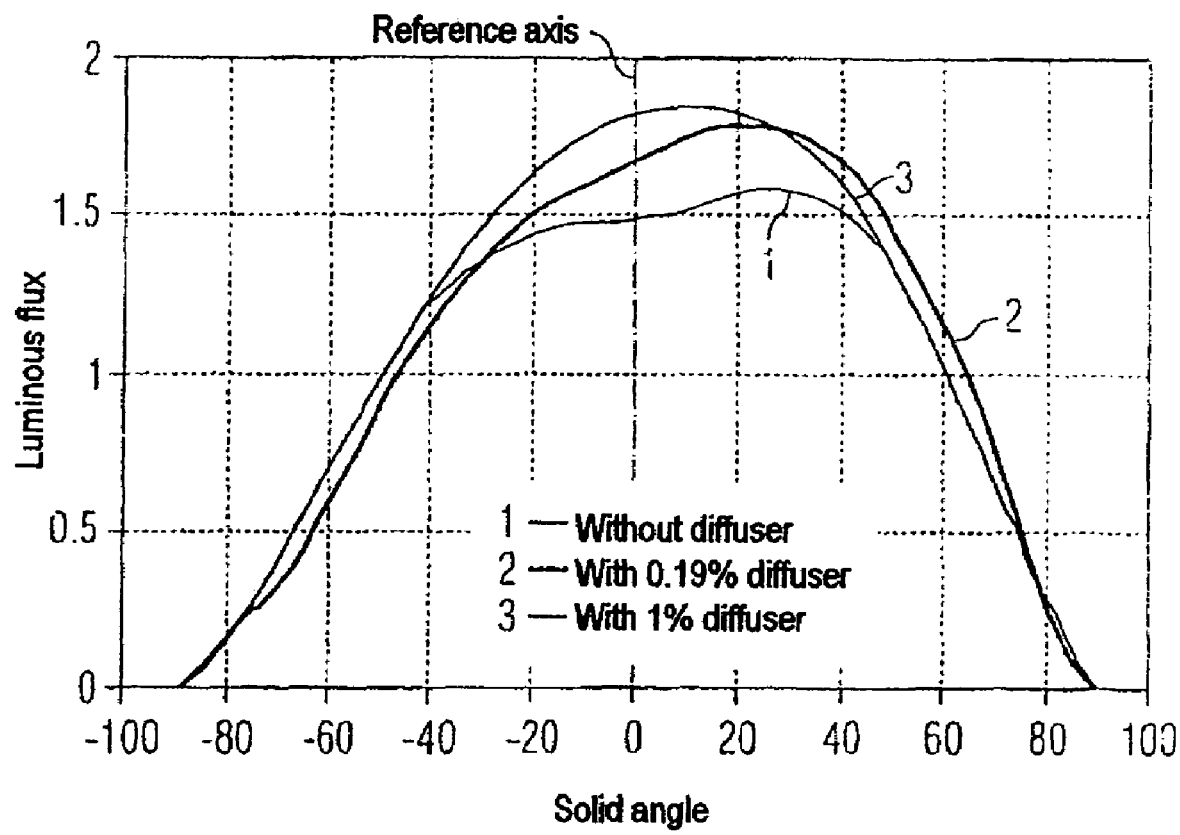

Luminous intensity at 20 mA in MCD

|  | A | B | C | D | E |
|---|---|---|---|---|---|
| Diffuser concentration | 0 | 0.19% | 0.50% | 1% | 1.50% |
| Amber (615 nm) | 115.0 | 116.0 | 115.0 | 117.0 | 112.0 |
| True green (526 nm) | 103.0 | 110.0 | 115.0 | 124.0 | 120.0 |
| Blue (467 nm) | 27.1 | 30.0 | 29.0 | 33.0 | 32.0 |

Relative luminous intensity at 20 mA

|  | A | B | C | D | E |
|---|---|---|---|---|---|
| Diffuser concentration | 0 | 0.19% | 0.50% | 1% | 1.50% |
| Amber (615 nm) | 100% | 100.9% | 100.0% | 101.7% | 97.4% |
| True green (526 nm) | 100% | 106.8% | 111.7% | 120.4% | 116.5% |
| Blue (467 nm) | 100% | 110.7% | 107.0% | 121.8% | 118.1% |

1 Amber (615 nm)
2 True green (526 nm)
3 Blue (467 nm)

Luminous flux at 20 mA in MLM

|  | A | B | C | D | E |
|---|---|---|---|---|---|
| Diffuser concentration | 0 | 0.19% | 0.50% | 1% | 1.50% |
| Amber (615 nm) | 316.0 | 321.0 | 310.0 | 314.0 | 297.0 |
| True green (526 nm) | 361.0 | 370.0 | 359.0 | 362.0 | 342.0 |
| Blue (467 nm) | 96.0 | 106.0 | 94.3 | 99.5 | 94.3 |

Relative luminous flux at 20 mA

|  | A | B | C | D | E |
|---|---|---|---|---|---|
| Diffuser concentration | 0 | 0.19% | 0.50% | 1% | 1.50% |
| Amber (615 nm) | 100% | 100.9% | 100.0% | 101.7% | 97.4% |
| True green (526 nm) | 100% | 106.8% | 111.7% | 120.4% | 116.5% |
| Blue (467 nm) | 100% | 110.7% | 107.0% | 121.8% | 118.1% |

1 Amber (615 nm)
2 True green (526 nm)
3 Blue (467 nm)

A: without diffuser
B: with diffuser Concentration 0.19%
C: with diffuser Concentration 0.5%
D: with diffuser Concentration 1%
E: with diffuser Concentration 1.5%

A: without diffuser
B: with diffuser Concentration 0.19%
C: with diffuser Concentration 0.5%
D: with diffuser Concentration 1%
E: with diffuser Concentration 1.5%

A: without diffuser
B: with diffuser Concentration 0.19%
C: with diffuser Concentration 0.5%
D: with diffuser Concentration 1%
E: with diffuser Concentration 1.5%

Luminous intensity at 20 mA in MCD

|  | A | B | D |
|---|---|---|---|
| Diffuser concentration | 0 | 0.19% | 1% |
| Amber (614 nm) | 201.1 | 202.2 | 207.5 |
| True green (532 nm) | 317.1 | 325.2 | 374.2 |
| Blue (465 nm) | 68.4 | 71.3 | 80.3 |

Relative luminous intensity at 20 mA

|  | A | B | D |
|---|---|---|---|
| Diffuser concentration | 0 | 0.19% | 1% |
| Amber (614 nm) | 100% | 100.5% | 103.2% |
| True green (532 nm) | 100% | 102.6% | 118.0% |
| Blue (465 nm) | 100% | 104.2% | 117.4% |

Luminous flux at 20 mA in MLM

|  | A | B | D |
|---|---|---|---|
| Diffuser concentration | 0 | 0.19% | 1% |
| Amber (614 nm) | 597.0 | 586.0 | 576.0 |
| True green (532 nm) | 1093.0 | 1100.0 | 1093.0 |
| Blue (465 nm) | 240.4 | 238.4 | 240.6 |

Relative luminous flux at 20 mA

|  | A | B | D |
|---|---|---|---|
| Diffuser concentration | 0 | 0.19% | 1% |
| Amber (614 nm) | 100% | 98.2% | 96.5% |
| True green (532 nm) | 100% | 100.6% | 100.0% |
| Blue (465 nm) | 100% | 99.2% | 100.1% |

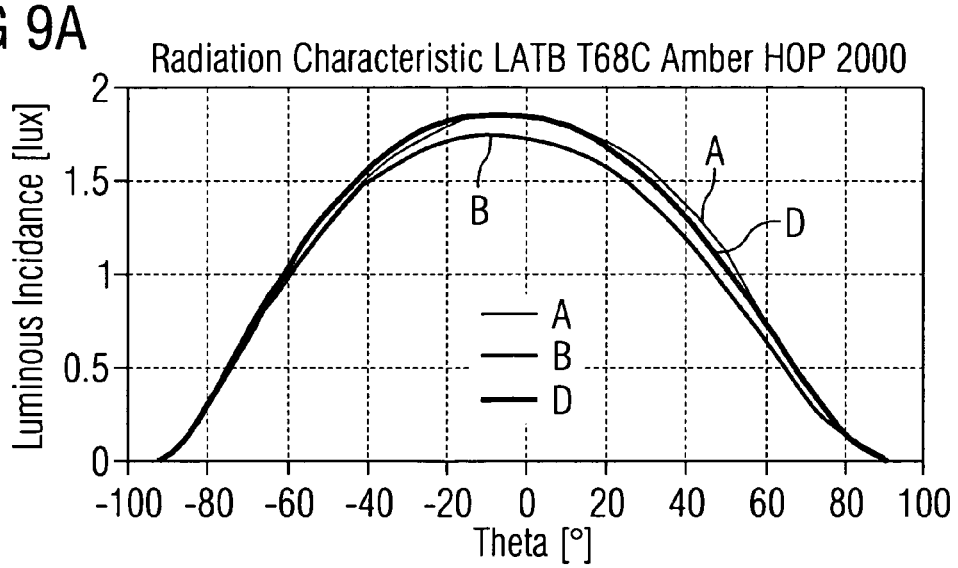
FIG 9A Radiation Characteristic LATB T68C Amber HOP 2000
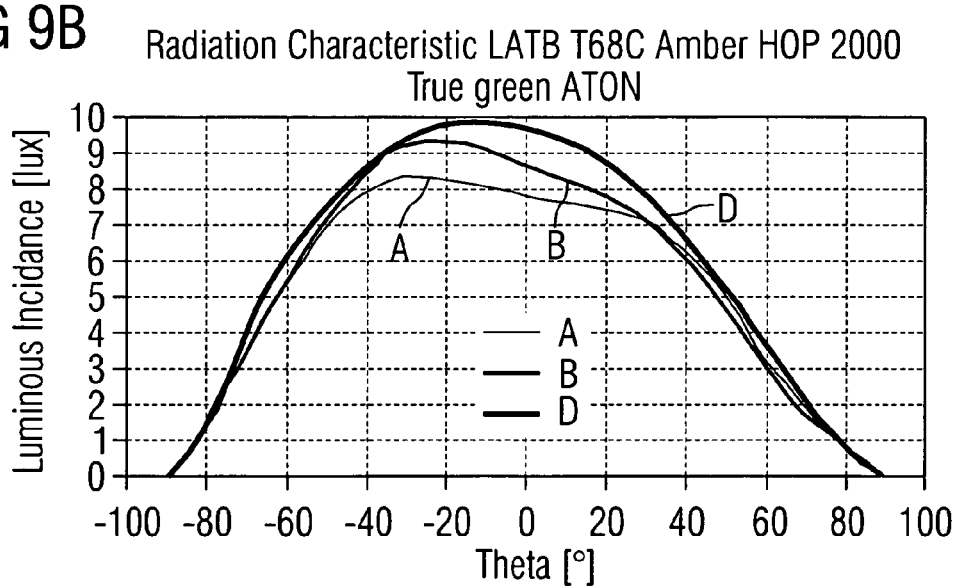
FIG 9B Radiation Characteristic LATB T68C Amber HOP 2000 True green ATON
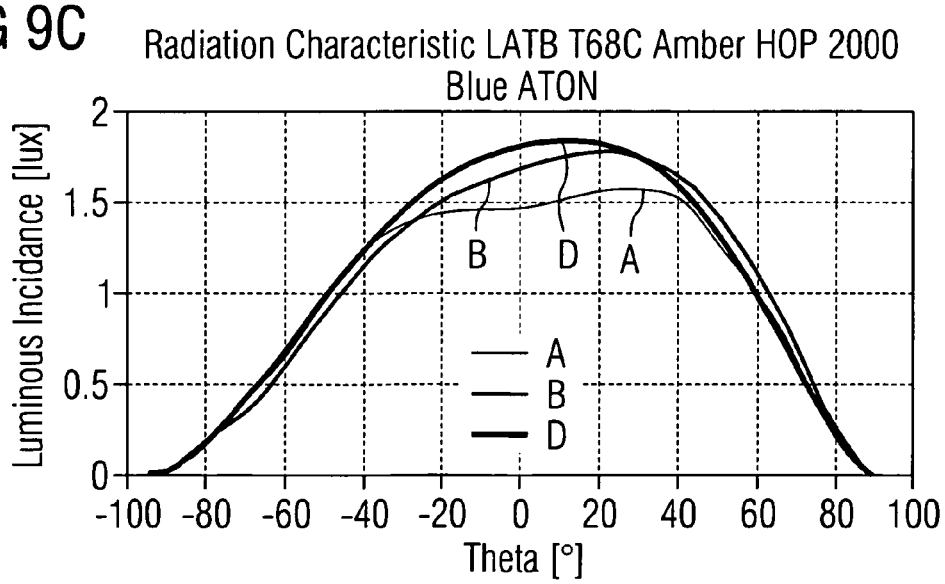
FIG 9C Radiation Characteristic LATB T68C Amber HOP 2000 Blue ATON

FIG 10A

Luminous intensity in CD

| Diode current | 10 mA | 20 mA | 30 mA |
|---|---|---|---|
| TOPLED clear resin | 0.043 | 0.085 | 0.119 |
| TOPLED diffuse resin | 0.046 | 0.091 | 0.127 |
| M_TOP clear resin | 0.035 | 0.066 | 0.091 |
| M_TOP diffuse resin | 0.035 | 0.067 | 0.093 |

FIG 10B

Relative luminous intensity

| Diode current | 10 mA | 20 mA | 30 mA |
|---|---|---|---|
| TOPLED clear resin | 100% | 100% | 100% |
| TOPLED diffuse resin | 107% | 107% | 107% |
| M_TOP clear resin | 100% | 100% | 100% |
| M_TOP diffuse resin | 100% | 102% | 102% |

FIG 10C

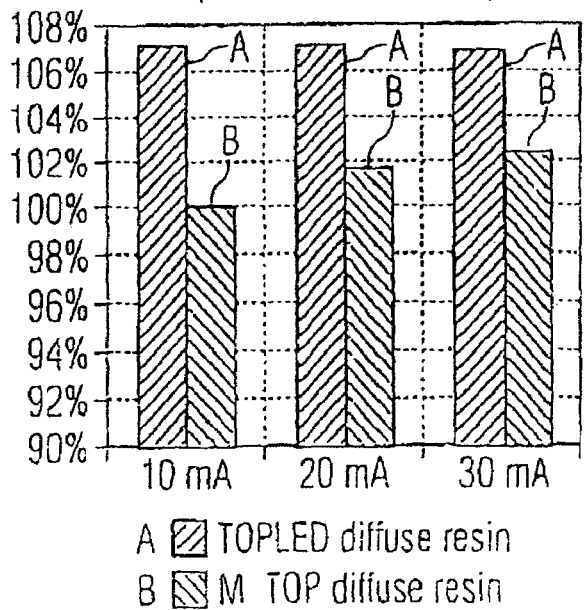

Impact of Diffuse Resin on Brightness Values (ATON)
(Clear resin = 100%)

A ▨ TOPLED diffuse resin
B ▨ M_TOP diffuse resin

FIG 11A

Luminous flux in lm

| Diode current | 10 mA | 20 mA | 30 mA |
|---|---|---|---|
| TOPLED clear resin | 0.14 | 0.276 | 0.39 |
| TOPLED diffuse resin | 0.14 | 0.276 | 0.389 |
| M_TOP clear resin | 0.099 | 0.196 | 0.274 |
| M_TOP diffuse resin | 0.097 | 0.19 | 0.266 |

FIG 11B

Relative luminous flux

| Diode current | 10 mA | 20 mA | 30 mA |
|---|---|---|---|
| TOPLED clear resin | 100% | 100% | 100% |
| TOPLED diffuse resin | 100% | 100% | 100% |
| M_TOP clear resin | 100% | 100% | 100% |
| M_TOP diffuse resin | 98% | 97% | 97% |

FIG 11C

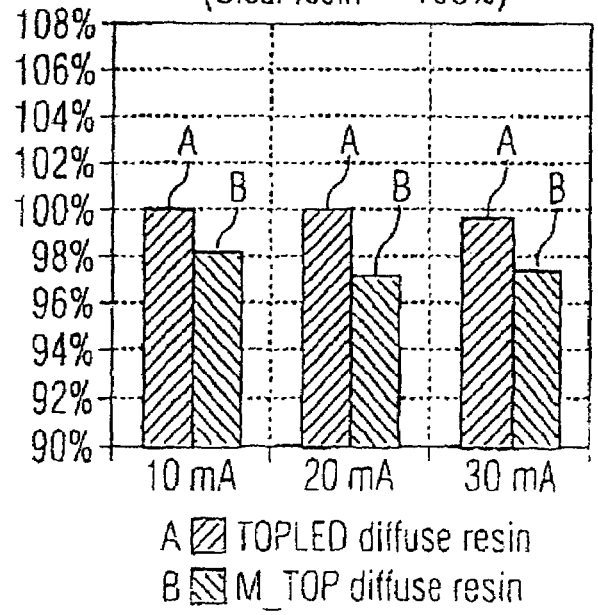

Impact of Diffuse Resin on Brightness Values (ATON)
(Clear resin = 100%)

A ▨ TOPLED diffuse resin
B ▧ M_TOP diffuse resin

OPTOELECTRONIC COMPONENT

RELATED APPLICATIONS

This is a U.S. national stage of application No. PCT/DE02/044048, filed on 02 Dec. 2002.

This patent application claims the priority of German patent applications Nos. 101 58 753.8 and 102 41 989.2, filed 30 Nov. 2001 and 11 Sep. 2002, respectively, the disclosure content of which is hereby incorporated by reference.

FIELD OF THE INVENTION

The invention relates to an optoelectronic component, in particular a surface-mountable optoelectronic component.

The invention relates to an optoelectronic component, in particular a surface-mountable optoelectronic component.

BACKGROUND OF THE INVENTION

In the case of conventional surface-mountable optoelectronic components, first of all a pre-housed device is produced by encapsulating a prefabricated leadframe with a suitable plastics material by injection molding, said plastics material forming the housing of the device. Said device has a depression or recess for example at the top side, into which depression or recess leadframe terminals are introduced from two opposite sides, a semiconductor chip such as an LED chip, for example, being adhesively bonded and electrically contacted on one leadframe terminal. A clear radiation-transmissive potting composition is then filled into said recess. This basic form of surface-mountable optoelectronic components is disclosed for example in the article "SIEMENS SMT-TOPLED für die Oberflächenmontage" ["SIEMENS SMT-TOP LED FOR SURFACE MOUNTING"] by F. Möllmer and G. Waitl, Siemens Components 29 (1991), issue 4, pages 147-149.

In the case of these known surface-mountable designs, a highly directional radiation can be achieved by the sidewalls formed by the plastic housing being formed as inclined reflectors. Depending on the form of housing or form of reflector, the component may be constructed as a so-called toplooker, i.e. with a main radiating direction essentially perpendicular to the mounting plane of the component, or as a so-called sidelooker, i.e. with a main radiating direction essentially parallel or at an acute angle with respect to the mounting plane of the component. Examples of a toplooker and of a sidelooker with the corresponding forms of housing are shown for example in FIG. 2 and FIG. 3, respectively, of U.S. Pat. No. 5,035,483 A1.

Various conventional designs of optoelectronic components of the type mentioned in the introduction are illustrated diagrammatically in FIGS. 12 to 15.

In the case of FIG. 12, the semiconductor chip, such as an LED chip, for example, is incorporated in a narrow housing or basic body. In this housing, the beams emitted to the side by the semiconductor chip are reflected back onto the side areas of the semiconductor chip again by the basic body's sidewalls formed as reflectors and are absorbed, so that radiation is lost there.

In the case of the construction of a conventional optoelectronic component as illustrated in FIG. 13, a loss of light in the component is caused in particular by the special chip technology, in the case of which a large proportion of the emitted radiation is radiated obliquely rearward from the semiconductor chip. A substantial part of this radiation that is emitted obliquely rearward is absorbed by the basic body and lost.

FIGS. 14A and 14B show a side view and plan view, respectively, of a basic body in which a plurality of LED chips are incorporated in order, for example, to be able to generate arbitrary colors by mixing three primary colors. In this case, part of the radiation emitted laterally by the LED chips is absorbed by the side areas of the adjacent LED chips, as a result of which radiation is lost.

Finally, there are also known optoelectronic components whose basic body is made dark, as is illustrated in FIG. 15A. This embodiment is used, for example, in order to achieve a best possible contrast between the emission area of the component and the rest of the apparatus area, as can be discerned in FIG. 15B. Such a contrast improvement is used for example in indication or display technology. The dark housing has the disadvantage, however, that a certain proportion of the light emitted by the LED chip is absorbed at the dark sidewalls of the recess, as a result of which the luminous efficiency is reduced.

Moreover, especially in the case of components having a plurality of LED chips, as are shown for example in FIG. 14, a light emergence from the emission area of the component is produced which is nonuniform and acts in an off-center fashion. In addition, the plurality of LED chips are necessarily not all arranged in centered fashion, so that, when the component is observed laterally, the light emissions of the individual LED chips may be important to different extents and thus, for example, the color mixing in the case of multicolor LEDs becomes angle-dependent from a certain degree.

On account of the clear radiation-transmissive potting composition, the LED chips and the wirings thereof can in part be distinguished from short distances. Particularly in the case of a narrowing of the radiation characteristic in order to achieve a higher luminous intensity, the chip surface is projected onto the emission area of the component. Furthermore, in the event of incidence of extraneous light, a deficient contrast is produced as a result of the extraneous light reflected at the emission area and the chip surface.

In order to avoid the abovementioned disadvantageous phenomena such as low efficiency, disturbing projections of the chip surfaces and wirings, nonuniform light emission and contrast deficiency, at the present time use is made for example of optoelectronic components which achieve a higher efficiency through higher-quality and thus also more cost-intensive chip technologies in the case of which, in particular the LED chips principally emit light via the chip surface.

For applications in the field of indication or display technology, in which a good contrast during the light emission is important, the prior art discloses, on the one hand, making the component surface dark, as is indicated in FIG. 15B, or using upstream diaphragm apparatuses in order to shade the LED chips from incidence of extraneous light.

SUMMARY OF THE INVENTION

One object of the present is to provide an improved optoelectronic component of the type mentioned in the introduction.

A particular object of the present invention is to provide a more uniform light emission and a better contrast with the optoelectronic component.

These and other objects are attained in accordance with one aspect of the invention directed to an optoelectronic component comprising a radiation-emitting semiconductor chip arranged in a recess of a basic body or housing. The semiconductor chip being is embedded in the recess at least partly in a chip encapsulation, which is essentially transmissive with respect to a radiation emitted by the semiconductor chip. The chip encapsulation is formed in diffusely scattering fashion such that a large part of a radiation emitted laterally toward the basic body or housing by the semiconductor chip is deflected toward a radiation coupling-out area of the chip encapsulation before it impinges on an area of the basic body or housing that delimits the recess.

According to an embodiment of the present invention, the radiation-transmissive chip encapsulation, preferably a plastic encapsulation, is formed in diffusively scattering fashion and, for this purpose, preferably contains diffuser particles, that is to say radiation-scattering particles, at which radiation emitted by the LED chip is scattered. Beams emitted toward the side from the semiconductor chip are scattered at the diffuser particles in such a way that they are at least to a great extent no longer absorbed at the sidewalls of the recess of the basic body and/or, after reflection at the sidewalls of the recess, at the side areas of the semiconductor chip. The proportion of the radiation that emerges through the emission area of the component forward, that it to say essentially in the direction of the optical axis, is therefore increased. This improves the efficiency of the component.

The content of diffuser in the chip encapsulation is dimensioned such that the radiation in the axial direction is significantly increased compared with an identical type of chip encapsulation without a diffuser. The content of diffuser is particularly preferably dimensioned such that the radiation in the axial direction is significantly increased and, at the same time, the total light radiation is only insignificantly reduced.

The concentration range is preferably dimensioned such that the light gain in the axial direction is greater than the total light loss caused by the diffuser particles (inter alia through absorption at the diffuser particles) in the component.

The term axial direction relates to the optical axis of the LED chip.

In this case, the introduction of diffuser particles is not aimed at expanding the light radiation angle, but rather has the effect that more light is emitted forward by the component and a projection of the chip and of the bonding wire is avoided at the same time.

In the case of a component according to an embodiment of the present invention, compared with inherently identical components without diffuser particles in the chip encapsulation, more light is emitted forward. The scattering at the diffuser particles is evidently more effective than the reflection at sidewalls of the recess of the basic body, which is indeed to be considered as surprising.

This effect is beneficial very particularly in the case of chips which emit a substantial part of electromagnetic radiation generated in the chip via chip side areas, for example via side areas of the substrate on which the semiconductor layer sequence produced epitaxially is situated. Such LED chips are referred to hereinafter as laterally emitting LED chips. This is especially the case for example with the LED chips described in U.S. Pat. No. 6,730,939 and U.S. Ser. No. 10/203,728 which are hereby incorporated by reference.

Such LED chips, which are designated below by "ATON" and, if appropriate, a subsequent color indication, are characterized by the fact that a considerable part of the radiation generated in the chip is emitted laterally rearward, and thus not in the radiating direction of the component, via at least one side area region running obliquely, in curved fashion or in stepped fashion with respect to the main direction of extent of a radiation-generating epitaxial layer sequence. In this case, the sidewall region is inclined toward the rear side of the chip. Particularly in the case of components with such LED chips, the diffuser particles in the chip encapsulation surprisingly bring about forward radiation that is significantly increased compared with such components without diffuser particles in the chip encapsulation.

In addition, the radiation emitted by the semiconductor chips is distributed uniformly by the diffuser particles. This has the effect, on the one hand, that the light is radiated uniformly through the emission area of the component, and, on the other hand, that a projection of the chip surfaces and also wirings of the LED chips is avoided.

A further advantage of the measure according to an embodiment of the invention resides in the fact that the diffuser particles act not only on the light emitted by the LED chips but also on the extraneous light incident externally. In contrast to a clear potting composition without diffuser particles, the extraneous light is therefore not reflected back, but rather reflected diffusively, so that the component ensures a better contrast.

A particular advantage of an embodiment of the invention also consists, inter alia, in the fact that the contrast behavior of components according to the invention is better than in the case of conventional surface-emitting components, which is of great importance particularly with regard to display applications. Moreover, the luminance of components according to the invention is lower since the emitting area is larger. Emission is effected by the entire area of the chip encapsulation provided with diffuser particles. A further advantage of the invention consists in the fact that disturbing reflections of sunlight at the component are thereby reduced.

The proportion of diffuser particles in the transparent potting composition is preferably between approximately 0.1% and 10% by weight, particularly preferably between 0.15% and approximately 3.0%, especially preferably between approximately 0.75% and approximately 1.25%. This applies in particular to diffuser particles in epoxy casting resin, preferably CaF diffuser particles.

As in the case of conventional optoelectronic components the transparent potting composition may be an epoxy resin and the basic body may be produced from a thermosetting plastic or thermoplastic material, so that conventional production methods can advantageously be used.

In order to further improve the contrast during the light emission, it is advantageous in accordance with an embodiment of the invention for at least one surface of the basic body, in particular the surface directed forward, to be made dark or even black.

BRIEF DESCRIPTION OF THE DRAWINGS

FIG. 3 shows a diagram of a radiation characteristic of an optoelectronic component according to the present invention in comparison with a conventional component;

FIGS. 9A to 9C show diagrams of the radiation characteristics for the various LED chips which were measured during the second series of experiments on an optoelectronic component according to the present invention;

FIGS. 10A to 10C show tabular and graphical illustrations of measurement results of the luminous intensity which were obtained during a third series of experiments on an optoelectronic component according to the present invention;

FIGS. 11A to 11C show tabular and graphical illustrations of measurement results of the luminous flux which were obtained during the third series of experiments on an optoelectronic component according to the present invention;

DETAILED DESCRIPTION OF THE DRAWINGS

Firstly, the basic construction of an optoelectronic component according to the present invention is explained with reference to FIG. 1. Various possible embodiments of the component and the mode of action according to the invention are subsequently described with reference to FIGS. 2 and 3. Finally, the inventors carried out three series of experiments, the measurement results of which are illustrated with reference to FIGS. 4 to 11.

Figure 1:
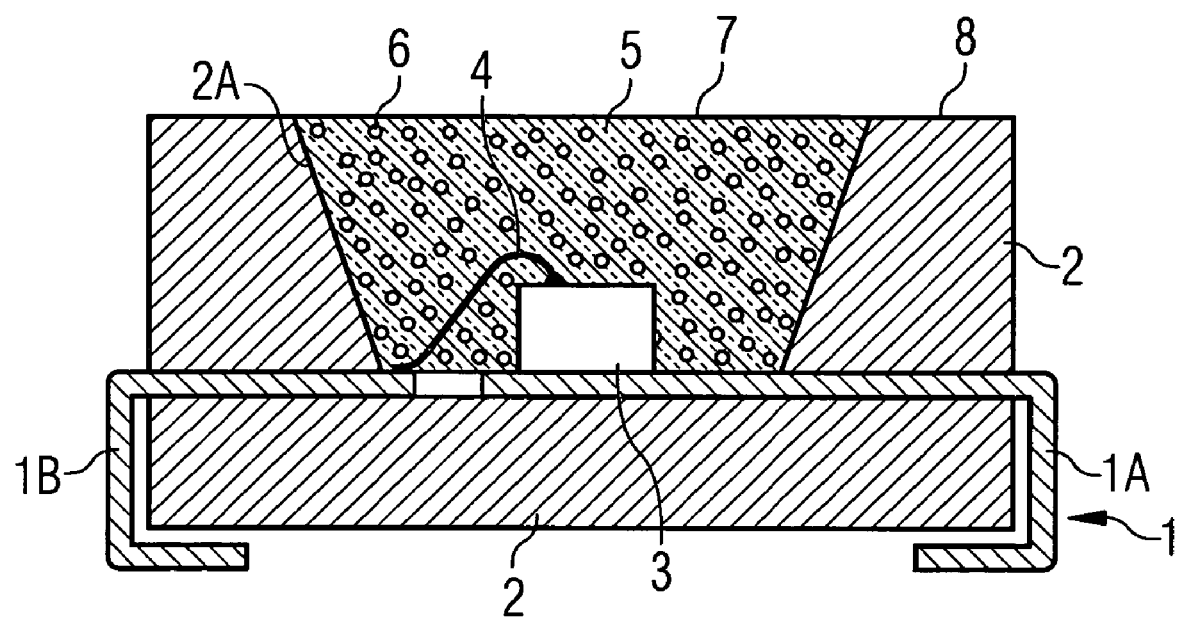
FIG. 1 shows a diagrammatic illustration of the basic construction of an optoelectronic component according to the present invention in section.

FIG. 1 illustrates a diagrammatic cross-sectional view of a surface-mountable optoelectronic component formed according to the present invention. The basic body 2 for the component is formed by encapsulating a leadframe 1 with a suitable plastic material by injection molding while forming a housing. The housing 2 has a central recess, in which a semiconductor chip 3 such as an optoelectronic transmitter chip, for example, is arranged and is electrically conductively connected to the electrical terminals 1A, 1B of the leadframe 1 by means of bonding wire technology 4.

The inner areas 2A of the recess of the basic body 2 are preferably formed obliquely, as is shown in FIG. 1. By virtue of the selection of a suitable material for the basic body 2 with a high reflectivity, these oblique inner areas 2A may additionally serve as reflectors in order to increase the radiating power or the reception sensitivity of the optoelectronic component.

It should be pointed out that at this juncture that the present invention is not only restricted to the toplooker construction (cf. introduction to the description) illustrated in the exemplary embodiments shown. In particular, it is also possible, of course, to construct components with a sidelooker construction (cf. introduction to the description) using the measure according to the invention.

By way of example, a plastic material, preferably a thermoplastic or thermosetting plastic, is used for the basic body 2 of the component. It has been established in the past that what is particularly suitable for this is polyphtalamide, for example, which may additionally be admixed with glass fibers.

The optoelectronic semiconductor chip 3 is embedded in a chip encapsulation 5, for example a transparent potting composition. In this case, the emission area or radiation coupling-out area 7 of the chip encapsulation 5, said area being remote from the semiconductor chip 3, terminates essentially with the surface 8 of the basic body 2. However, it is pointed out that, within the scope of the present invention, other filling heights of the chip encapsulation 5 in the recess of the basic body 2 may also be chosen, of course, as required.

The material used for the chip encapsulation 5 is usually a transparent material which preferably has UV-initiated or light-initiated cationically curing properties. A preferred material 5 contains a UV-initiated or light-initiated cationically curing epoxy resin which is incipiently cured or pre-fixed within a few seconds by being exposed to light or UV radiation and can be completely cured thermally at a later point in time. However, suitable materials are also acrylic resins (such as PMMA) or silicon resins, for example.

According to the present invention, the chip encapsulation 5 is formed in diffusively scattering fashion. This is preferably achieved by the chip encapsulation 5 containing diffuser particles 6 which diffusively scatter the radiation, in particular light, impinging on them.

The proportion of the diffuser particles in the transparent potting composition is between approximately 0.15% and approximately 2.0%, preferably between approximately 0.75% and approximately 1.25%, and particularly preferably approximately 1.0%. The optimum proportion of the diffuser particles depends, inter alia, on the structural height of the component or its elements (e.g., the number of LED chips in the component).

It should be pointed out at this juncture that the present invention is not restricted to specific diffuser particles. The person skilled in the art of optoelectronics and/or optics will find without difficulty the diffuser particles suitable for his purposes, the size and material composition of which diffuser particles may depend, inter alia, on the wavelength of the radiation to be scattered. The choice of suitable diffuser particles will depend in particular on the wavelength of the light emitted or to be received by the LED chips 3.

In addition, depending on the choice of material of the basic body 2 and the desired optical properties of the optoelectronic component, the chip encapsulation 5 may contain, in addition to its main constituent of the epoxy resin specified above and the diffuser particles, additionally further portions in order to set the strength of bonding with the basic body material, the incipient curing and full curing time, the light transmissivity, the refractive index, the thermo stability, the mechanical hardness, etc., as desired.

FIGS. 2A to 2D show various designs of optoelectronic components in which the component configuration according to the invention can preferably be used.

Figure 2A:
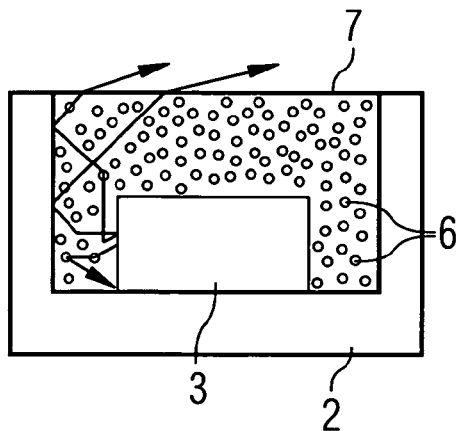
FIGS. 2A to 2F show various preferred embodiments of optoelectronic components according to the present invention in a greatly simplified illustration.

Thus, FIG. 2A shows a component with a principally laterally emitting LED chip 3 in a narrow recess in the basic body 2. The laterally emitted radiation is partly scattered at the diffuser particles 6 present in the chip encapsulation 5, so that this proportion of the radiation is not absorbed again by the side areas of the LED chip 3 after reflection at the sidewalls of the recess. In this way, the proportion of the radiation emitted through the emission area 7 of the component becomes larger in comparison with conventional optoelectronic components, i.e. the efficiency of the component is increased.

The same principle also applies if, instead of the light-emitting LED chip 3, use is made of an optoelectronic sensor for receiving radiation. In this case, too, the efficiency of the component is increased since, on account of the scattering of the incident radiation at the diffuser particles 6, a greater proportion of the incident radiation can be received by the side areas of the semiconductor chip.

By virtue of the diffuser particles 6 in the chip encapsulation 5, not only is the efficiency of the component increased, but the light radiated through the emission area is distributed more uniformly over the entire emission area 7 and, in addition, prevents a projection of the chip surface or the wirings 4.

Moreover, by virtue of the diffuse scattering of the light emitted by the LED chip 3, the radiation characteristic of the LED chip is centered (i.e., as shown in FIG. 3, the maximum of the luminous flux shifts toward a solid angle of 0° and the radiation characteristic becomes more symmetric even if it were off-center for example on account of the incorporation of a plurality of LED chips 3 in the component without the diffuser particles. This is illustrated in the diagram of FIG. 3. While the curve designated by 1 shows the radiation characteristic of a conventional blue LED chip 3 which is off-center toward the right in the illustration of FIG. 3, the radiation characteristic becomes better centered with an increasing proportion of diffuser particles to as much as 1%, as is specified by the two curves 2 and 3. The higher measured value, moreover, of the luminous flux in the case of curves 2 and 3 results from the fact that the measurement was effected relative to the reference axis.

A further advantage of the diffuser particles 6 in the chip encapsulation 5 is manifested in particular in the field of application of indication or display technology, where the incidence of extraneous light poses a problem, in principle, for a clear and distinct indication of information. In contrast to a clear resin as potting composition 5, the incident extraneous light is not mirrored, but rather reflected diffusively owing to the diffuser particles 6. As a result, the extraneous light loses intensity, which leads to a better contrast of the indication or display even in the event of incidence of extraneous light.

Figure 2B:
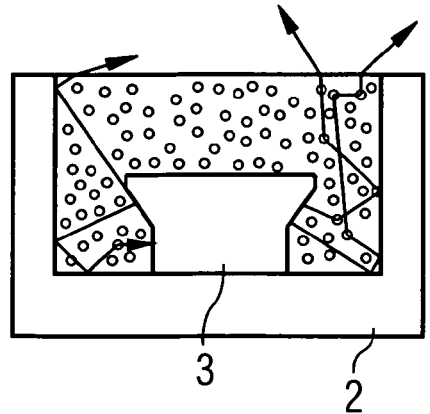

FIG. 2B illustrates an optoelectronic component with an LED chip 3 in the case of which a large proportion of the emitted light is radiated from the chip sidewalls obliquely rearward, that is to say in the direction of the interior of the housing. This is caused by sidewall regions which run inward obliquely, in curved fashion or in stepped fashion with respect to the main direction of extent of the epitaxial layer sequence, as shown in detail in FIGS. 2E and 2F, respectively. Such LED chips 3, which are designated below by "ATON" and, if appropriate, a color indication, are described for example in the documents WO 01/61764 and WO 01/61765, the disclosure content of which is hereby incorporated by reference in this respect. In contrast to conventional concepts of component housings which are essentially based on reflection at the inner walls of the recess, here the emitted light is scattered at the diffuser particles distributed in the chip encapsulation and deflected to the front side of the component. This leads to the advantages already mentioned (cf. introduction to the description and description of the embodiment in accordance with FIG. 2A. The advantageous effect of the configuration of the chip encapsulation according to the invention is especially beneficial in the case of a component in accordance with FIG. 2B.

Figure 2C:
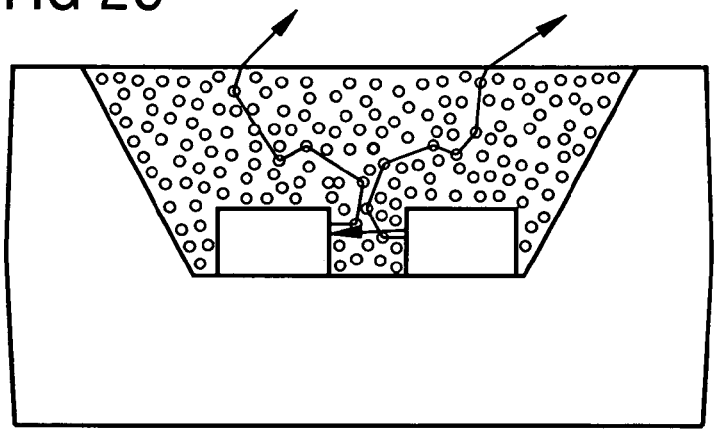

FIG. 2C shows a component with a plurality of LED chips 3, as is used for example for the construction of a multicolor LED component. In the case of conventional components, up to 30% of the light emitted by the LED chips 3 is in this case absorbed by other LED chips and the steep sidewalls of the recess. By virtue of the diffuser particles 6 provided according to the invention, the light can be deflected before impinging on the side areas of the adjacent LED chips and the sidewalls of the recess and thus leave the component through the emission area 7.

Figure 2D:
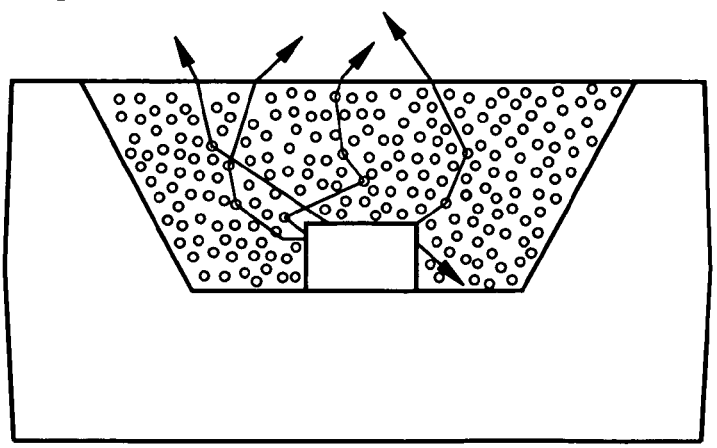
Figure 2E:
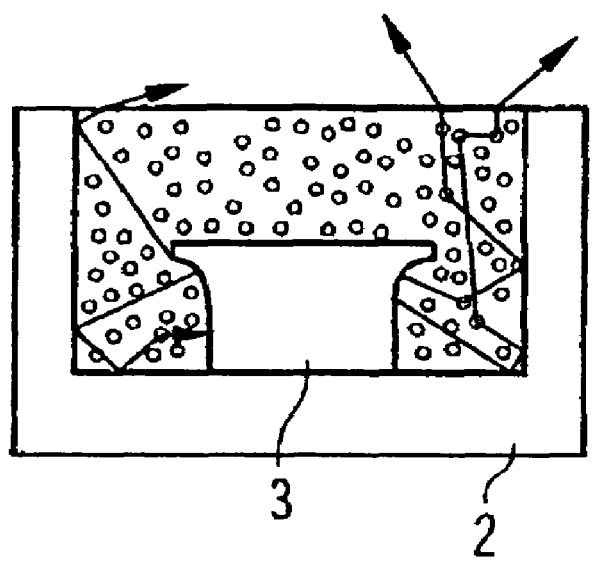
Figure 2F:
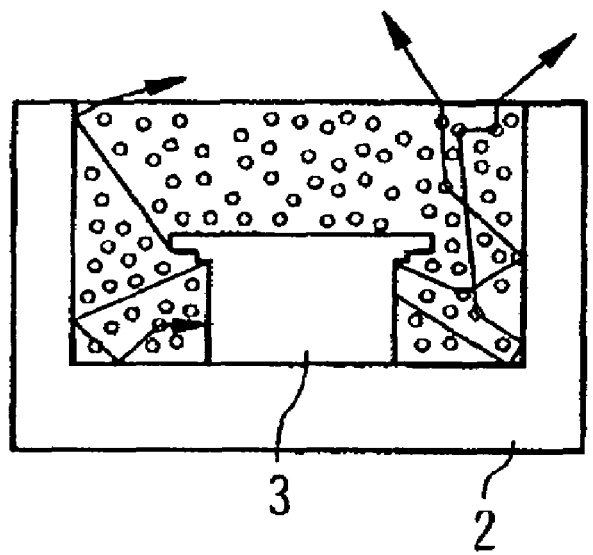

Finally, FIG. 2D shows a component with a dark or black basic body 2. Here, too, the light is deflected by the diffuser particles 6 in the potting composition 5 before impinging on the black side walls of the recess and passes to the emission area 7 of the component.

It goes without saying that all of the advantages mentioned, such as, in particular, higher efficiency, more uniform light emission, centered radiation characteristic, avoidance of the projection of chip surfaces and better contrast, occur in all the exemplary embodiments shown, even if said advantages have not been repeated again in all the exemplary embodiments shown.

A description will now be given below of a total of three series of experiments which were carried out on optoelectronic components constructed according to the present invention.

$1^{st}$ Series of Experiments

Figure 15A:
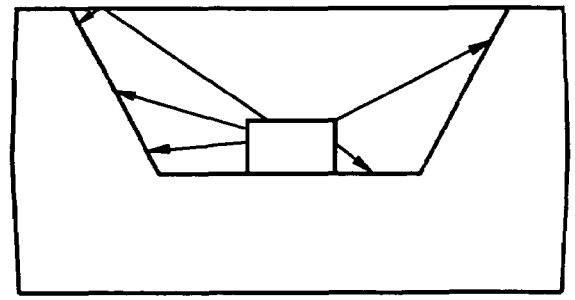
Figure 15B:
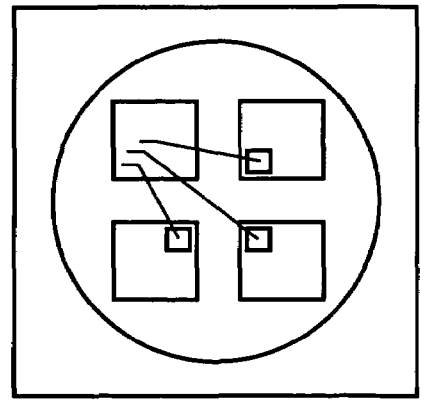

During the first series of experiments, a three-color LED component (also referred to as RGB (Red Green Blue) multiLED) was measured, said component, in plan view, corresponding approximately to the illustration of FIG. 15B and having a completely black basic body. The three LED chips emit radiation in the orange ("HOP amber") wavelength range of approximately 615 nm, in the green ("ATON true green") wavelength range of approximately 526 nm and in the blue ("ATON blue") wavelength range of approximately 467 nm.

Figures 4A, 4B, 4C:
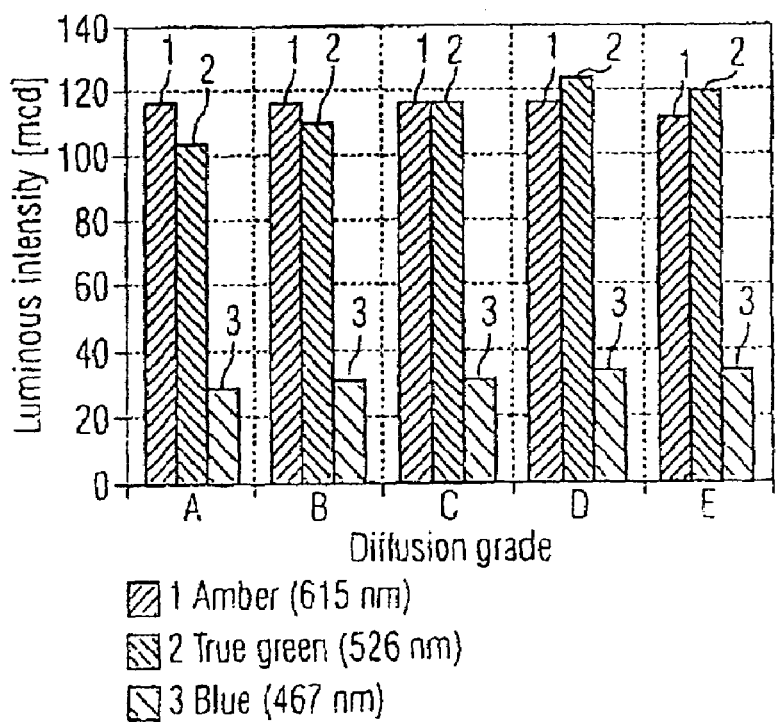
FIGS. 4A to 4C show tabular and graphical illustrations of measurement results of the luminous intensity which were obtained during a first series of experiments on an optoelectronic component according to the present invention.

The table illustrated in FIG. 4A shows the luminous intensities in mcd ($10^{-3}$ Candela) measured for a diode current of 20 mA for different concentrations or proportions of diffuser particles in the potting composition of 0.19%, 0.50%, 1.0% and 1.50%. The measured value for a conventional component with a potting composition without diffuser particles (proportion 0%) is specified for comparison purposes. The same measured values are again illustrated in the bar chart of FIG. 4C.

Furthermore, the table of FIG. 4B illustrates the relative luminous intensities referred to 100% for a potting composition without diffuser particles. As specified, the invention made it possible to achieve an increase in the luminous intensity by up to 21.8% (diffuser proportion 1.0%, blue LED).

Figures 5A, 5B, 5C:
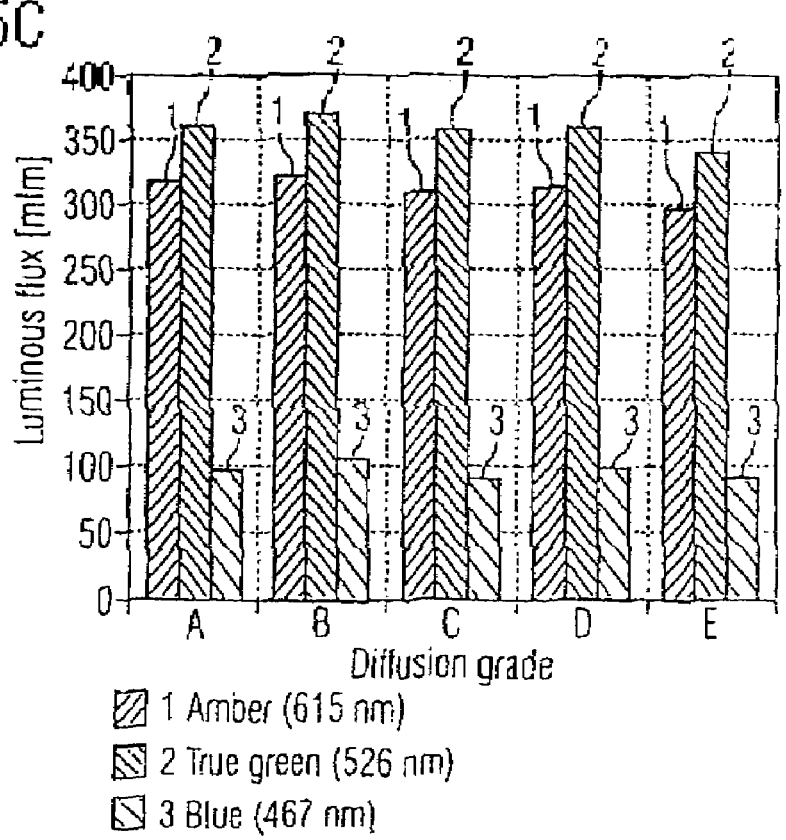
FIGS. 5A to 5C show tabular and graphical illustrations of measurement results of the luminous flux which were obtained during the first series of experiments on an optoelectronic component according to the present invention.

FIGS. 5A to 5C show the results of the same series of experiments, here the luminous flux in mlm ($10^{-3}$ Lumen) and the relative luminous flux respectively being specified and plotted instead of the luminous intensity.

Figure 6A:
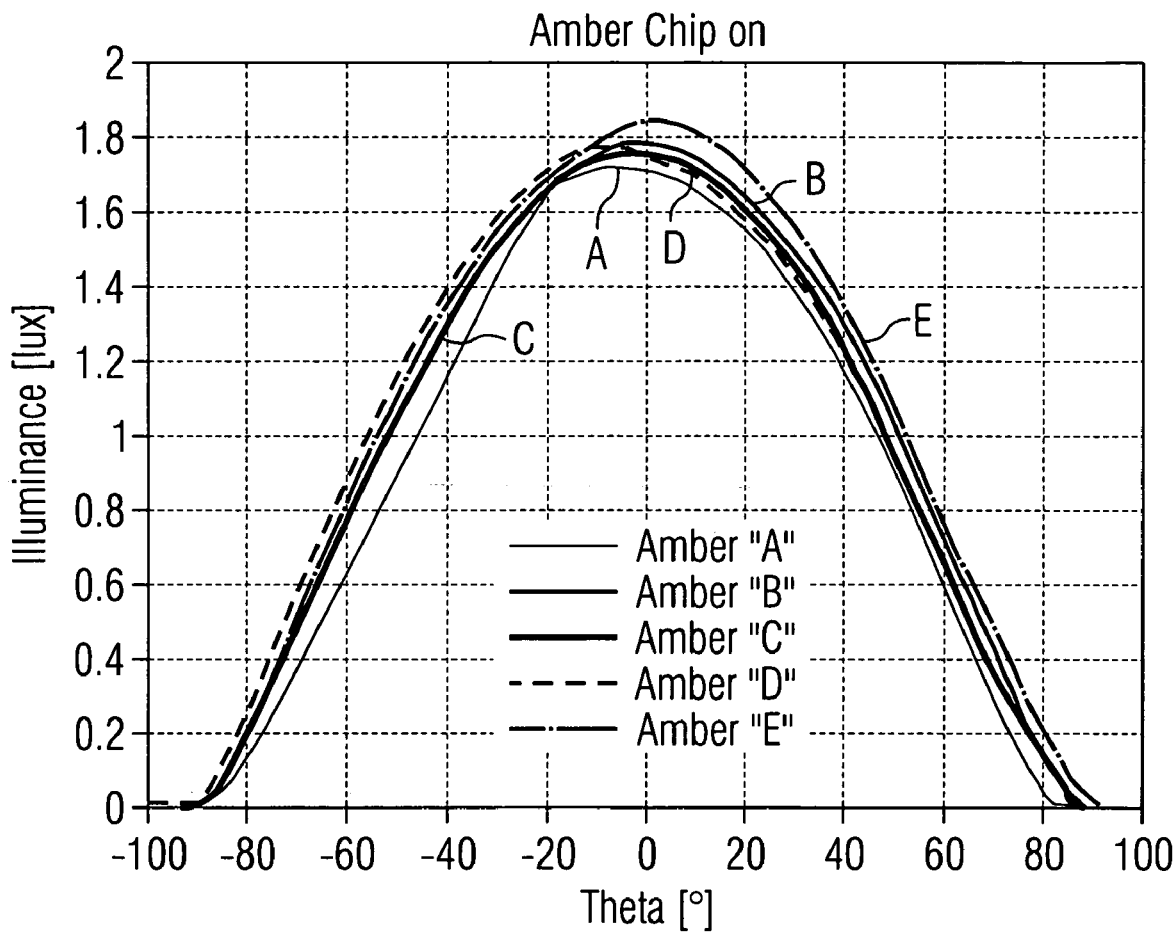
FIGS. 6A to 6C show diagrams of the radiation characteristics for the various LED chips which were measured during the first series of experiments on an optoelectronic component according to the present invention.
Figure 6B:
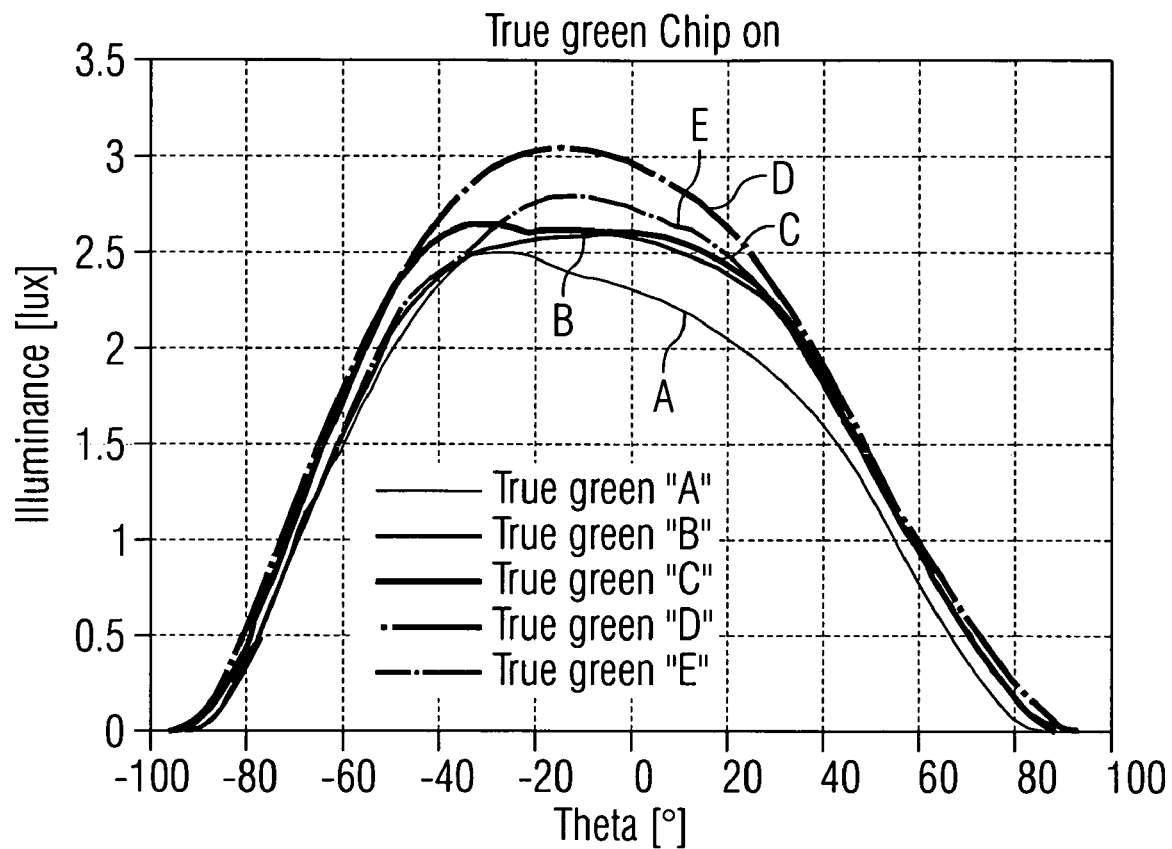
Figure 6C:
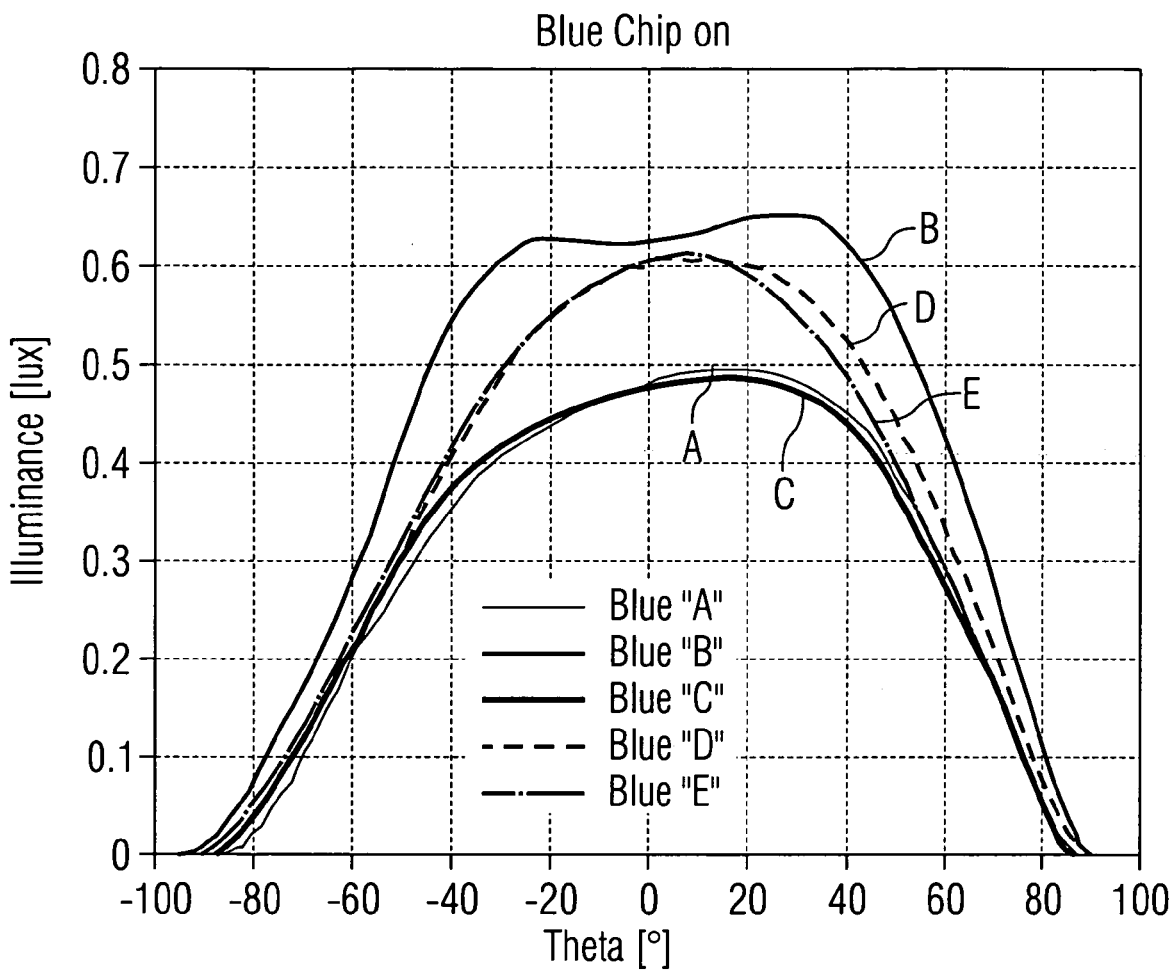

Finally, FIGS. 6A to 6C respectively show the radiation characteristic of the orange, green and blue LED chip 3 for the different proportions of the diffuser particles in the potting composition. As is clearly discernible, the proportion of diffuser particles results in a more uniform and more centered radiation characteristic than in the case of a potting composition without diffusively scattering properties. Furthermore, it can be discerned that the best results with regard to the radiation characteristic can be achieved in the case of a proportion of diffuser particles of approximately 1%. Moreover, it can be seen that the advantages are particularly distinct in the case of the chips with principally lateral radiation ("ATON").

$2^{nd}$ Series of Experiments

During the second series of experiments, a three-color RGB multiLED was likewise measured which, however, in contrast to the first series of experiments, was provided with a white basic body. The three LED chips once again emitted radiation in the orange ("HOP amber") wavelength range of about 614 nm, in the green ("ATON true green") wavelength range of approximately 532 nm and in the blue ("ATON blue") wavelength range of approximately 465 nm, respectively.

Figures 7A, 7B, 7C:
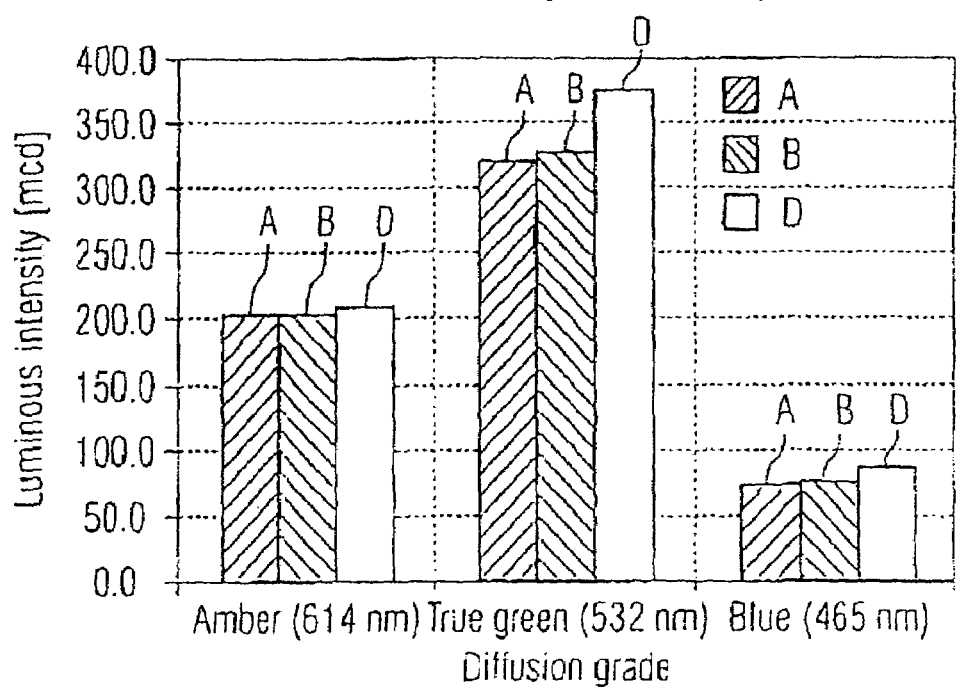
FIGS. 7A to 7C show tabular and graphical illustrations of measurement results of the luminous intensity which were obtained during a second series of experiments on an optoelectronic component according to the present invention.

The table illustrated in FIG. 7A shows the luminous intensities in mcd measured for a diode current of 20 mA for the different concentrations of diffuser particles in the potting composition of between 0% and 1.0%. The same measured values are also illustrated in the bar chart of FIG. 7C.

The table of FIG. 7B shows the relative luminous intensities referred to 100% for a potting composition without diffuser particles. As illustrated, the invention, in the case of this experimental set up, made it possible to achieve an increase in the luminous intensity by up to 18% (diffuser proportion 1.0%, green LED).

Figures 8A, 8B, 8C:
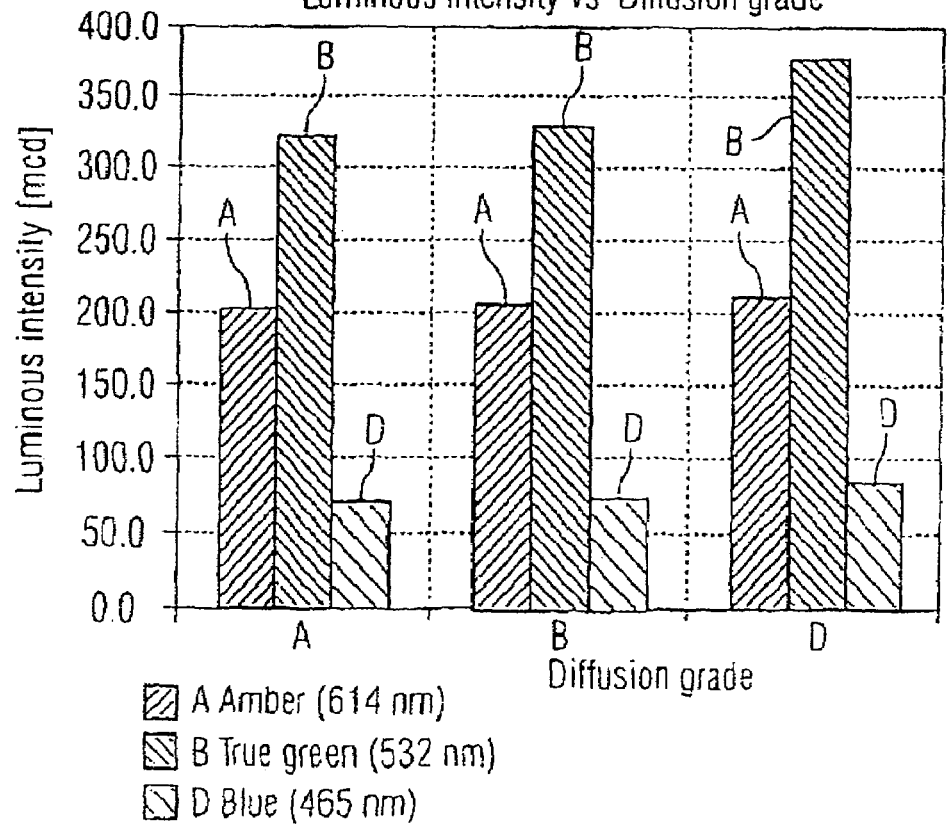
FIGS. 8A to 8C show tabular and graphical illustrations of measurement results of the luminous flux which were obtained during the second series of experiments on an optoelectronic component according to the present invention.
Figure 12:
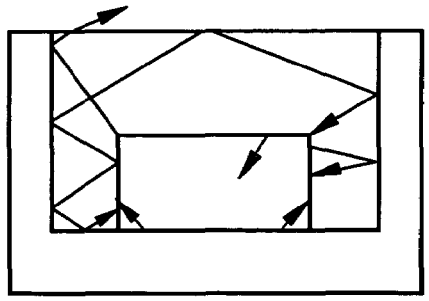
FIGS. 12 to 15B show diagrammatic illustrations of various embodiments of conventional optoelectronic components.
Figure 13:
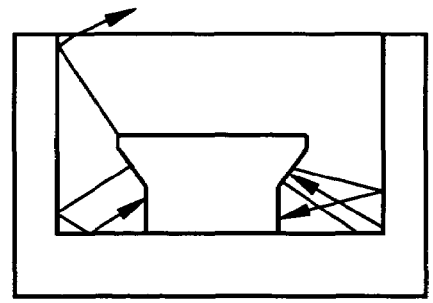
Figure 14A:
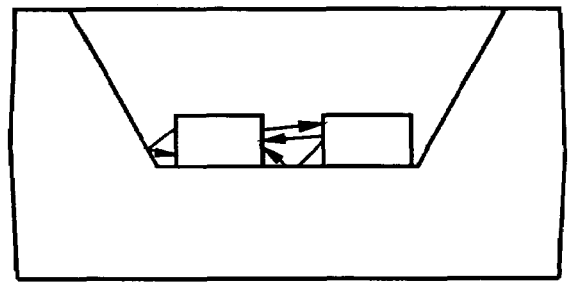
Figure 14B:
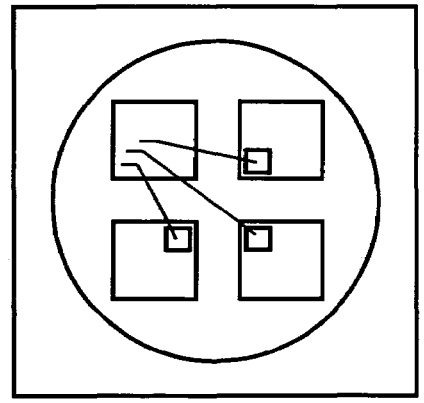

FIGS. 8A to 8C show the results of the same series of experiments, here the luminous flux in mlm and the relative luminous flux respectively being specified and plotted instead of the luminous intensity.

Finally, FIGS. 9A to 9C show the progressive improvement in the respective radiation characteristic of the orange, green and blue LED chip 3 on account of the increased proportions of diffuser particles in the potting composition.

3$^{rd}$ Series of Experiments

Finally, optoelectronic components according to the present invention with individual blue ("ATON blue") LED chips were investigated during the third series of experiments. In this case, so-called TOPLEDs and mini TOPLEDs with a proportion of diffuser particles of approximately 1% in the potting composition were compared with corresponding components without diffuser particles in the potting composition.

The table of FIG. 10A shows the luminous intensities in cd (Candela) measured for diode currents of 10 mA, 20 mA and 30 mA, and the table of FIG. 10B shows the relative luminous intensities measured for diode currents of 10 mA, 20 mA and 30 mA with respect to the components with a potting composition without diffuser particles (100%). The measured values of the luminous intensities are also illustrated in the bar chart of FIG. 10C.

In the case of the mini TOPLEDs, increases of 2% in the luminous intensity were able to be achieved by virtue of the diffusively scattering potting composition, while even increases of up to 7% were achieved in the case of the TOPLEDs.

FIGS. 11A to 11C again show the results of the same series of experiments, here the luminous flux in lm (Lumen) and the relative luminous flux respectively being specified and plotted instead of the luminous intensity.

Figure 16:
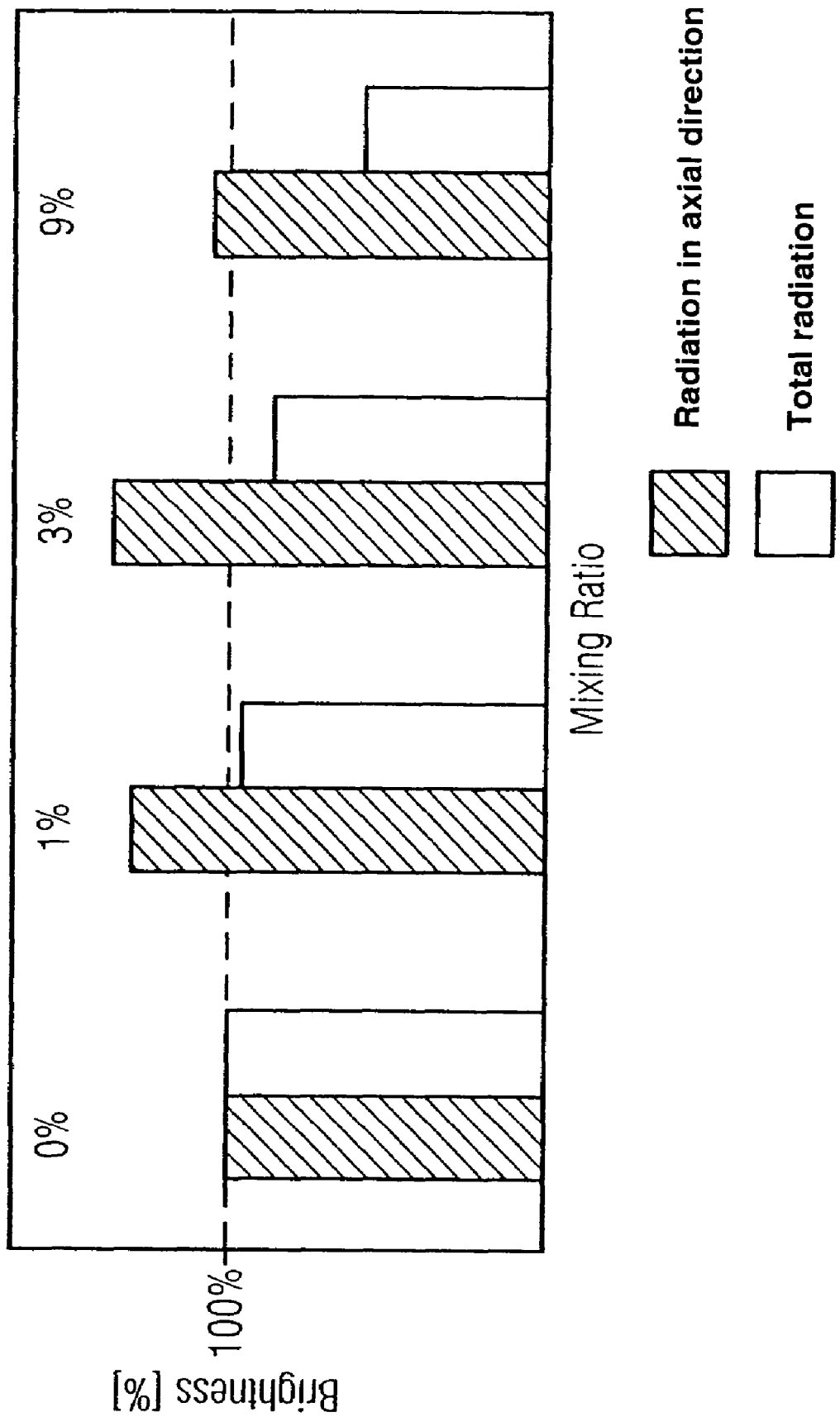
FIG. 16 shows a diagram which plots the brightness in the forward direction and the total brightness as a function of the diffuser content, for a component with CaF as diffuser material in an epoxy resin chip potting and an InGaN-based LED chip in a surface-mountable LED housing.

It can be seen from the diagram illustrated in FIG. 16 that firstly, as the diffuser content increases, the light radiation in the axial direction increases without the total light radiation simultaneously decreasing drastically before the total light radiation and also the forward radiation then decrease again as the diffuser content increases further. In the diagram, four pairs of bars are plotted for four different concentrations of diffuser particles in the potting composition, of which the left-hand bar in each case represents the brightness in the forward direction (or axial direction) and the right-hand bar in each case represents the total light radiation. The illustration shows pairs of bars for four different concentrations, to be precise for a diffuser proportion of 0%, 1%, 3% and 9% in the potting composition. The concentration of diffuser particles that is respectively associated with the pairs of bars is in each case specified above the pairs of bars. The values determined for a diffuser content of 0% are used as a reference. The measured values were determined on a light-emitting diode component in accordance with FIG. 1. The LED chip was an InGaN-based LED chip with an SiC substrate which emits a substantial proportion of the radiation generated in the chip via the chip sidewalls. The diffuser material was CaF. It can be discerned that there is a maximum of forward radiation in the case of a diffuser proportion of approximately 3% in the potting composition. A significant increase in the forward radiation with at the same time virtually negligible losses of total light power results for a diffuser proportion of around 1%.

The light-emitting diode components with a diffuser proportion according to the invention in the chip potting have a significantly improved contrast behavior compared with light-emitting diode components of the same type without a diffuser. Moreover, a projection of the LED chip and, if appropriate, of bonding wires is advantageously significantly reduced, depending on the diffuser content, in the case of the light-emitting diode components according to the invention. Light is radiated via the entire front side of the chip potting.

It should be generally noted at this juncture that light-scattering luminescent material particles contained in the potting composition, as are employed for example in white-light-emitting light-emitting diode components based on blue-light-emitting LED chips, can simultaneously act as diffuser particles and thus can at least partly bring about or support the effect according to the invention.

It has furthermore been established that the admixture of diffuser particles in a potting composition containing luminescent material particles, as are employed for example for white-light-emitting light-emitting diode components mentioned above, can bring about an increase in the light radiation in the axial direction. What is decisive in this case is that the diffuser particles are admixed with the potting composition in a suitable concentration.

For the sake of completeness, it should also be noted that the term potting composition is not only to be understood to mean those chip encapsulation compositions which are processed by means of casting technology, rather that it also includes those chip encapsulation compositions which are applied to the chip by means of other technology, such as injection molding or transfer molding.

The invention is not restricted by the description of the invention on the basis of the exemplary embodiments. Rather, the invention encompasses any new feature and also any combination of features, which comprises in particular any combination of features in the patent claims, even if this combination is not explicitly specified in the patent claims.

The invention claimed is:

1. An optoelectronic component comprising:
   a radiation-emitting semiconductor chip arranged in a recess of a basic body or housing, the semiconductor chip being embedded in the recess at least partly in a chip encapsulation, which is essentially transmissive with respect to a radiation emitted by the semiconductor chip;
   wherein the chip encapsulation is formed in a diffusely scattering fashion;
   wherein a sidewall of the recess is black;
   wherein the chip encapsulation contains radiation-scattering particles at which the radiation generated in the semiconductor chip is scattered; and
   wherein a proportion of radiation-scattering particles in the chip encapsulation is between approximately 0.75% and approximately 1.25%.

2. The optoelectronic component as claimed in claim 1, wherein the chip encapsulation has a reaction resin.

3. The optoelectronic component as claimed in claim 1, wherein the sidewalls of the recess in the basic body are formed as reflectors.

4. The optoelectronic component as claimed in claim 1, wherein the basic body or the housing is produced from a thermosetting plastic or thermoplastic material.

5. The optoelectronic component as claimed in claim 3, wherein at least one front side of the basic body or housing is made black.

6. The optoelectronic component as claimed in claim 1, wherein a plurality of semiconductor chips are arranged next to one another in the recess.

7. The optoelectronic component as claimed in claim 6, wherein the semiconductor chips in each case emit radiation of only one spectral color and the various semiconductor chips emit radiation of different colors.

8. The optoelectronic component as claimed in claim 1, wherein the semiconductor chip or at least one of the semiconductor chips has at least one sidewall region through which a substantial part of the radiation generated in the chip is emitted laterally or rearward in the direction of the basic body.

9. The optoelectronic component as claimed in claim 8, wherein the at least one sidewall region runs obliquely, in curved fashion or in stepped fashion with respect to the main direction of extent of a radiation-generating semiconductor layer sequence produced epitaxially.

10. The optoelectronic component as claimed in claim 1, wherein the chip encapsulation is formed in the diffusely scattering fashion such that a large part of radiation emitted laterally toward the basic body or housing by the semiconductor chip is deflected toward a radiation coupling-out area of the chip encapsulation before impinging on an area of the basic body or housing that delimits the recess.

11. The optoelectronic component as claimed in claim 1, wherein all sidewalls of the recess are black.

12. The optoelectronic component as claimed in claim 1, wherein the basic body or housing is black.

13. The optoelectronic component as claimed in claim 1, wherein the basic body or housing is produced from a material which is at least partly absorbent with respect to the radiation emitted by the semiconductor chip.

14. The optoelectronic component as claimed in claim 1, wherein the semiconductor chip emits a large part of its radiation via sidewalls of the chip.

15. The optoelectronic component as claimed in claim 1, wherein the chip encapsulation is formed in the diffusely scattering fashion such that a large part of the radiation emitted by the semiconductor chip in a direction away from a radiation coupling-out area of the chip encapsulation is deflected toward said radiation coupling-out area of the chip encapsulation.

16. The optoelectronic component as claimed in claim 2, wherein the reaction resin is one of an epoxy resin, an acrylic resin or a silicone resin.

17. An optoelectronic component comprising:
a radiation-emitting semiconductor chip arranged in a recess of a basic body, the semiconductor chip being embedded in the recess at least partly in a chip encapsulation, which is essentially transmissive with respect to a radiation emitted by the semiconductor chip;
wherein the chip encapsulation is formed in a diffusely scattering fashion;
wherein a sidewall of the recess is black;
wherein the chip encapsulation contains radiation-scattering particles at which the radiation generated in the semiconductor chip is scattered; and
wherein the semiconductor chip has at least one sidewall region through which a substantial part of the radiation generated in the chip is emitted laterally or rearward in the direction of the basic body.

18. The optoelectronic component as claimed in claim 17, wherein the proportion of radiation-scattering particles in the chip encapsulation is between approximately 0.1% and approximately 10%.

19. The optoelectronic component as claimed in claim 18, wherein the proportion of radiation-scattering particles in the chip encapsulation is between approximately 0.15% and approximately 3.0%.

20. The optoelectronic component as claimed in claim 19, wherein the proportion of radiation-scattering particles in the chip encapsulation is between approximately 0.75% and approximately 1.25%.

21. The optoelectronic component as claimed in claim 17, wherein the at least one sidewall region runs obliquely, in a curved fashion or in a stepped fashion with respect to a main direction of extent of a radiation-generating semiconductor layer sequence produced epitaxially.

22. A method for providing an optoelectronic component having an increased proportion of radiation which emerges through an emission area of the optoelectronic component in an axial direction, the method comprising:
arranging a radiation-emitting semiconductor chip in a recess of a basic body or housing; and
at least partly embedding the semiconductor chip in a chip encapsulation which is essentially transmissive with respect to the radiation emitted by the semiconductor chip;
wherein the chip encapsulation is formed in a diffusely scattering fashion by radiation-scattering particles contained in the chip encapsulation and at which the radiation generated in the semiconductor chip is scattered; and
wherein a proportion of radiation-scattering particles in the chip encapsulation is between approximately 0.75% and approximately 1.25% to increase the proportion of the radiation emerging through the emission area of the optoelectronic component in the axial direction.

* * * * *